United States Patent
Liu et al.

(10) Patent No.: US 9,640,848 B2
(45) Date of Patent: May 2, 2017

(54) ARTIFICIAL MICROSTRUCTURE AND METAMATERIAL WITH THE SAME

(75) Inventors: Ruopeng Liu, Shenzhen (CN); Lin Luan, Shenzhen (CN); Fanglong He, Shenzhen (CN); Zhiya Zhao, Shenzhen (CN); Chaofeng Kou, Shenzhen (CN); Jiawei He, Shenzhen (CN)

(73) Assignees: KUANG-CHI INNOVATIVE TECHNOLOGY LTD. (CN); KUANG-CHI INSTITUTE OF ADVANCED TECHNOLOGY (CN)

( * ) Notice: Subject to any disclaimer, the term of this patent is extended or adjusted under 35 U.S.C. 154(b) by 596 days.

(21) Appl. No.: 13/634,470

(22) PCT Filed: Oct. 27, 2011

(86) PCT No.: PCT/CN2011/081397
§ 371 (c)(1),
(2), (4) Date: Sep. 12, 2012

(87) PCT Pub. No.: WO2012/139369
PCT Pub. Date: Oct. 18, 2012

(65) Prior Publication Data
US 2013/0049903 A1    Feb. 28, 2013

(30) Foreign Application Priority Data

Apr. 12, 2011  (CN) .......................... 201110091122.2
Sep. 28, 2011  (CN) ............................ 201110298066

(51) Int. Cl.
  *H01P 1/203*  (2006.01)
  *H01P 7/08*   (2006.01)
  (Continued)

(52) U.S. Cl.
  CPC .......... *H01P 1/20381* (2013.01); *G02B 1/002* (2013.01); *H01P 7/082* (2013.01);
  (Continued)

(58) Field of Classification Search
  CPC .. H01P 1/203; H01P 1/20354; H01P 1/20372; H01P 1/20381; H01P 7/08; H01P 7/082; H01P 7/088
  (Continued)

(56) References Cited

U.S. PATENT DOCUMENTS 5,534,831 A * 7/1996 Yabuki et al. ................. 333/204
6,522,217 B1 * 2/2003 Shen ........................... 333/99 S
(Continued)

OTHER PUBLICATIONS

Morikazu et al, "Miniaturized Hairpin Resonator Filters and Their Application to Receiver Front-End MIC's", Dec. 1989, IEEE, vol. 37, p. 1991-1997.*
(Continued)

*Primary Examiner* — Robert Pascal
*Assistant Examiner* — Gerald Stevens
(74) *Attorney, Agent, or Firm* — Hauptman Ham, LLP

(57) ABSTRACT

An artificial microstructure made of conductive wires includes a split resonant ring with a split, and two curves. The two curves respectively start from first end and the second end of the split resonant ring and curvedly extend inside the split resonant ring, where the two curves do not intersect with each other, and do not intersect with the split resonant ring.

11 Claims, 17 Drawing Sheets

(51) Int. Cl.
*G02B 1/00* (2006.01)
*H05K 1/02* (2006.01)
*H01Q 15/00* (2006.01)
*H05K 1/16* (2006.01)

(52) U.S. Cl.
CPC ......... *H01Q 15/008* (2013.01); *H05K 1/0236* (2013.01); *H01P 1/20372* (2013.01); *H05K 1/024* (2013.01); *H05K 1/165* (2013.01)

(58) Field of Classification Search
USPC ................................ 333/204, 205, 219, 235
See application file for complete search history.

(56) References Cited

U.S. PATENT DOCUMENTS

| | | | | |
|---|---|---|---|---|
| 6,972,636 | B2* | 12/2005 | Murata | 333/99 S |
| 8,040,586 | B2* | 10/2011 | Smith et al. | 359/278 |
| 8,884,722 | B2* | 11/2014 | Mohajer-Iravani | H01P 1/2005 |
| | | | | 333/202 |
| 2005/0009709 | A1* | 1/2005 | Kai et al. | 505/210 |
| 2005/0253671 | A1* | 11/2005 | Hamada | H01P 1/20381 |
| | | | | 333/204 |
| 2010/0301971 | A1* | 12/2010 | Yonak et al. | 333/219.1 |
| 2012/0075692 | A1* | 3/2012 | Baik | G02F 1/21 |
| | | | | 359/344 |

OTHER PUBLICATIONS

Tony Kuphaldt, "Lessons in Electric Circuits," Oct. 18, 2006, Open Book Project, vol. I, p. 449-450.*
MIC Technology Corporation, "Applications and Design of Thin Film Capacitors," 1995, MIC Technology Corporation, p. 2.*

* cited by examiner

US 9,640,848 B2

ARTIFICIAL MICROSTRUCTURE AND METAMATERIAL WITH THE SAME

CROSS-REFERENCE TO RELATED PATENT APPLICATIONS

This is a U.S. National Phase Application under 35 U.S.C. §371 of International Patent Application No. PCT/CN2011/081397, filed Oct. 27, 2011, and claims the priority of Chinese Patent Application Nos. CN201110298066 X filed on Sep. 28, 2011, and CN201110091122.2 filed Apr. 12, 2011, all of which are incorporated by reference herein.

FIELD OF THE INVENTION

The exemplary disclosure relates to materials, and particularly, to an artificial microstructure and a metamaterial with the same.

BACKGROUND OF THE INVENTION

Metamaterials are a new synthetic material that is capable of response to electromagnetism. Metamaterials includes a substrate and a plurality of artificial microstructures attached to the substrate. The artificial microstructures are typically arranged into a certain geometric structure by metal wires to be in response to the electromagnetism, thereby allowing the metamaterial used in the artificial microstructures to generate an effect on electromagnetic characteristics of the metamaterial. Thus, metamaterials can achieve certain electromagnetic features that typical materials cannot achieve, such as converging or diverging electromagnetic waves, thereby metamaterials can be used in the electromagnetic communication field, such as antenna or radar. However, artificial microstructures, in the typical metamaterial usually occupy a large area, and go against miniaturization development of an electronic component or an electronic device.

Therefore, there is room for improvement within the art.

DISCLOSURE OF THE INVENTION

Aiming at the defect that the existing typical metamaterial occupies a large area, a technical problem to be solved in present invention is to provide an artificial microstructure and a metamaterial with the same which has the advantages of smaller volume, and higher integration effect.

The present invention provides an artificial microstructure. The artificial microstructure is made of conductive wires. The artificial microstructure includes a split resonant ring, a first curve and a second curve. The split resonant ring has a ring shape with a split. The first curve extends from a first end of the split resonant ring and curvedly extends inside the split resonant ring. The second curve extends from a second end of the split resonant ring and curvedly extends inside the split resonant ring. The first and second curves do not intersect with each other, and do not intersect with the split resonant ring.

The split resonant ring is at a shape of a Chinese character "凹" and the concave part of the split resonant ring is a split, the split resonant ring is made up of a rectangular split resonant ring and two parallel lines respectively extending from two distal ends of the rectangular split resonant ring.

The two curves are axial symmetrical distribution.

The split resonant ring is the rectangular split resonant ring.

The split resonance ring is a circular split ring.

The two curves are spirals extending spirally inside of the split resonant ring.

The spirals are circular spirals.

The spirals are square spirals.

The loop number of the spirals is greater than two.

The two curves respectively start from two distal ends of the split resonant ring and extend in a snake style along two sides of the split resonant ring.

An interval distance of each of the two curves is equal to a width of each of the two curves.

A corner of each of the two curves is a vertical corner.

The artificial microstructure is made of metal.

The artificial microstructure is a silver wire or a copper wire.

The artificial microstructure is made of non-metals.

The artificial microstructure is made of one of the group which consist of conductive plastic, indium tin oxide (ITO), carbon nanotubes, and black lead.

The present invention provides a metamaterial. The metamaterial includes a substrate and a plurality of artificial microstructures, the plurality of the artificial microstructure are attached to the substrate.

The plurality of the artificial microstructures are arranged into an array on the substrate.

the substrate is divided into a plurality of rectangular base units, and each of the rectangular base units is attached by an artificial microstructure Using the present disclosure, the metamaterial can reduce a volume of the artificial microstructure, and leads to a miniaturization of an electronic component or an electronic device. The artificial microstructure of the present disclosure can obviously increase the absolute value of a minus permeability of the metamaterial and satisfy some specific conditions to obtain the minus permeability.

Other advantages and novel features of the present disclosure will become more apparent from the following detailed description of preferred embodiment when taken in conjunction with the accompanying drawings.

DETAILED DESCRIPTION OF ILLUSTRATED EMBODIMENTS

To improve the electromagnetic characteristics of typical electromagnetic material in the existing technology, the present disclosure provides a magnetic resonant metamaterial, and compared with the existing materials and known metamaterial, has the advantages of smaller volume, and higher integration effect. As used herein, the term "split resonant ring" is a length of wire shaped in a ring-like fashion with a split. Further details of the split resonant ring will be discussed below.

Figure 1:
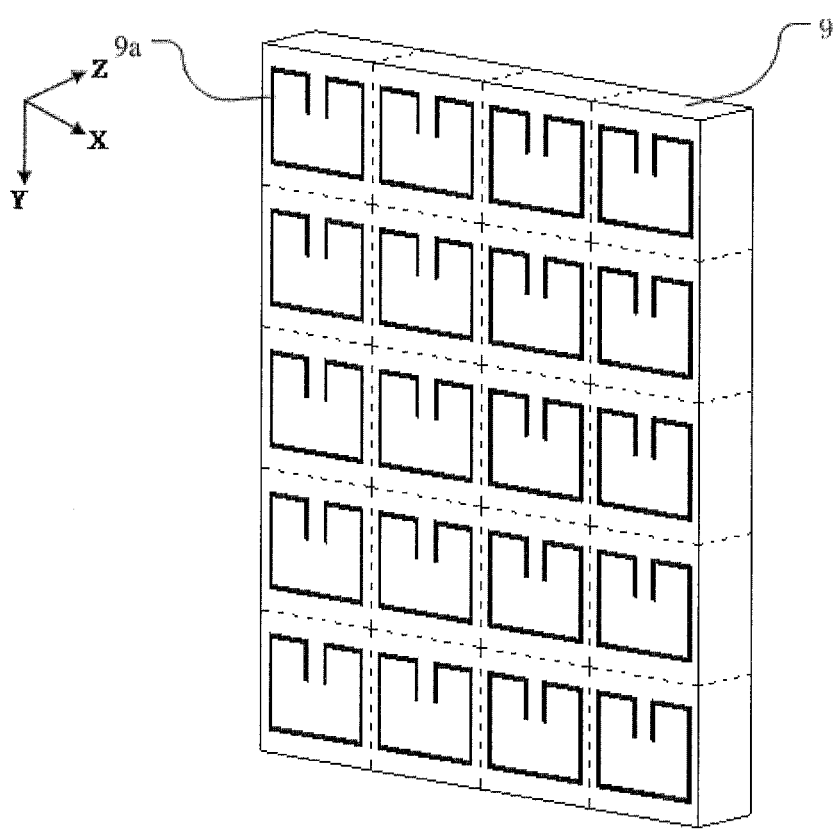
FIG. 1 illustrates one existing embodiment of a typical metamaterial.

FIG. 1 illustrates a typical metamaterial with a plurality of artificial microsturctures 9a, each artificial microstructure 9a is a typical split resonant ring.

Figure 2:
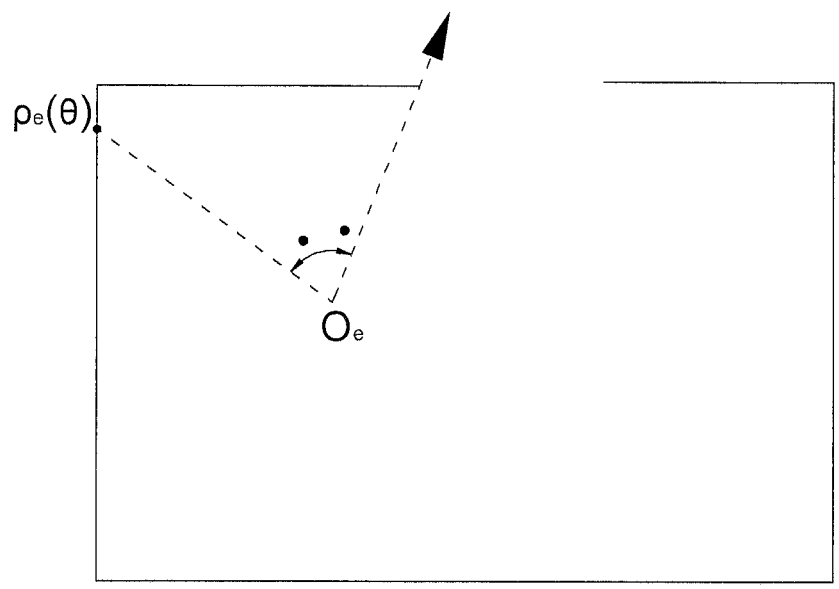
FIG. 2 illustrates one existing embodiment of a first typical split resonant ring.
Figure 3:
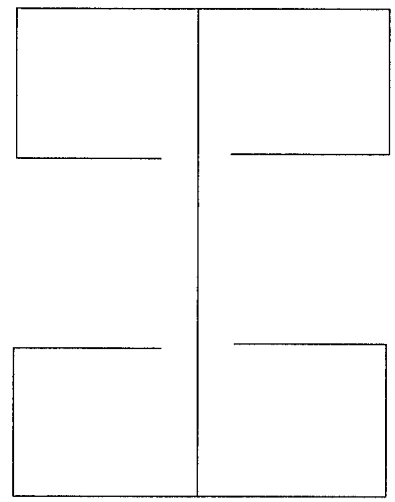
FIG. 3 illustrates one existing embodiment of a second typical split resonant ring.

Referring to FIGS. 2 and 3, FIG. 2 illustrates a first typical artificial microstructure, the first typical artificial microstructure is the first typical split resonant ring having a single split.

FIG. 3 illustrates a second typical artificial microstructure, the second typical artificial microstructure includes two first typical split resonant rings, and two splits of the two first typical split resonant rings are opposite to each other, a metal wire passes through the two splits to connect the two first typical split resonant rings together.

Figure 4:
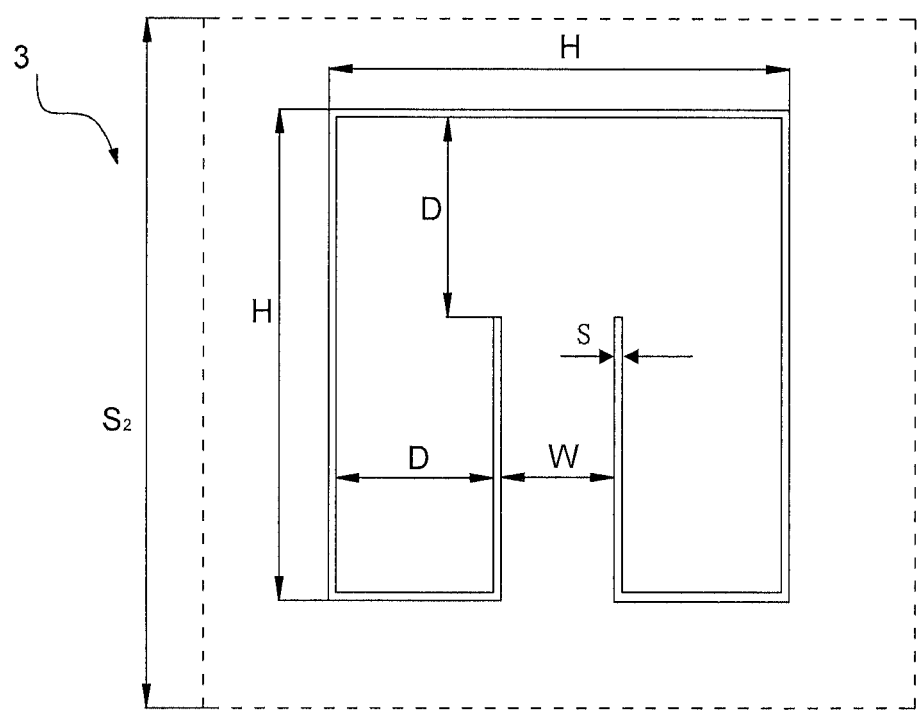
FIG. 4 illustrates one existing embodiment of a third typical split resonant ring.

FIG. 4 illustrates a third typical artificial microstructure similar to the first typical artificial microstructure as shown in FIG. 2, the third typical artificial microstructure includes two parallel lines on the basis of the first typical artificial microstructure. The two parallel lines respectively extend from a first end and a second end of the first typical split resonant ring. The two parallel lines is approximately in a shape "=," and the structure of the third typical artificial microstructure is approximately in a shape of Chinese character "匚", which has a split in a concave part of the Chinese character "匚."

Referring to FIGS. 1 to 4, the loop number of each typical split resonant ring is less than one. The "loop" in this context is defined as an angular coordinate value of 360° in a polar coordinate system, and can be explained as below: as shown in FIG. 2, an interior point on a circular surrounded by the first split resonant ring is used as a pole Oe, and a first end of the first typical split resonant ring is used as a polar axis of the polar coordinate system. Each point on the first typical split resonant ring is located in the polar coordinate system, and can be identified by a pair of coordinates ($\rho$ e, $\theta$), wherein $\rho$ e is a radial coordinates, $\theta$ is an angular coordinates from the polar axis in a counterclockwise. If an angular coordinate $\theta$ of the second end of the first typical split resonant ring is less than 360°, then the loop number of the first typical split resonant ring is less than one. Otherwise, the loop number of the first typical split resonant ring is equal to or greater than one.

Figure 5:
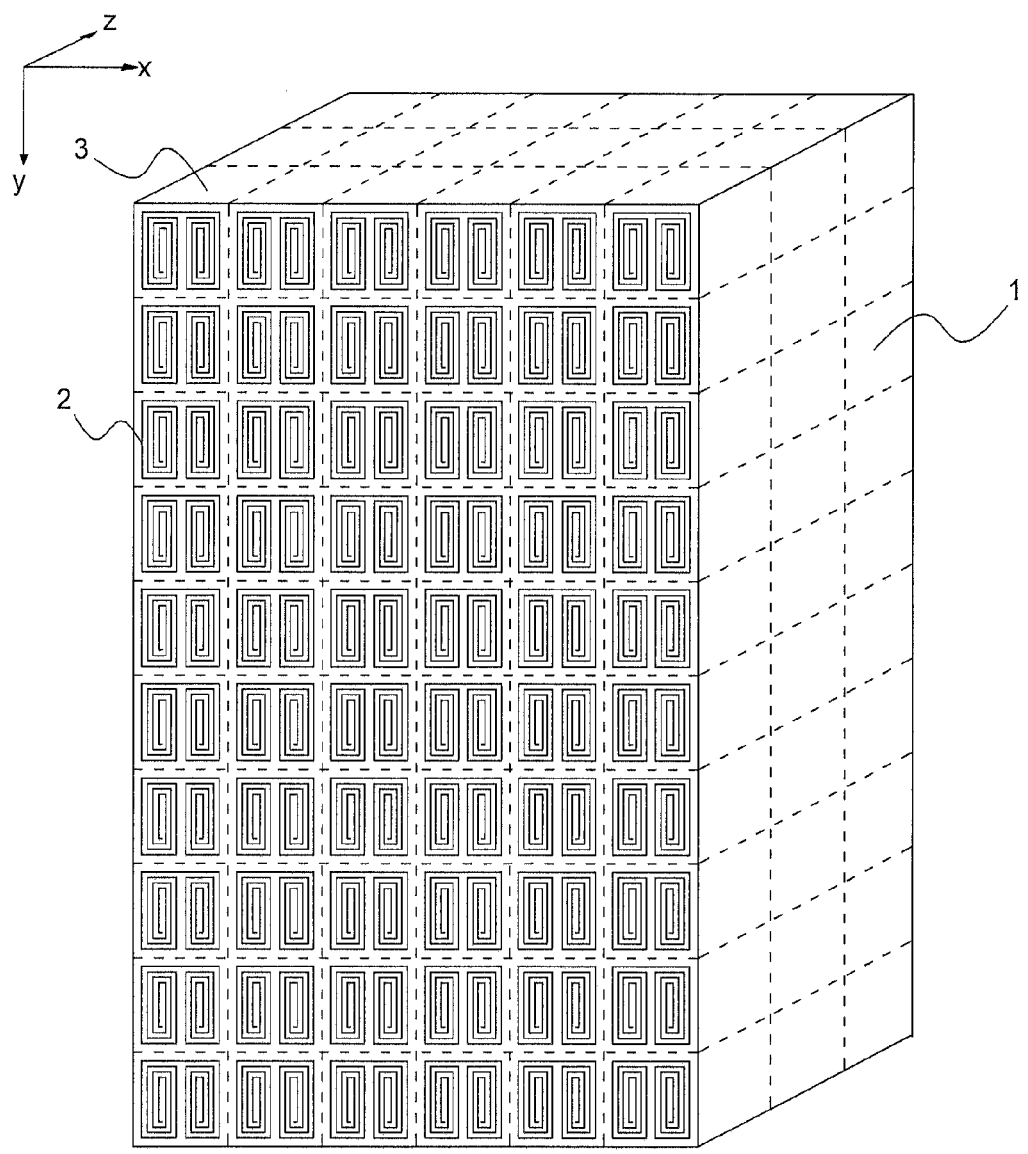
FIG. 5 illustrates a first embodiment of a metamaterial.
Figure 6:
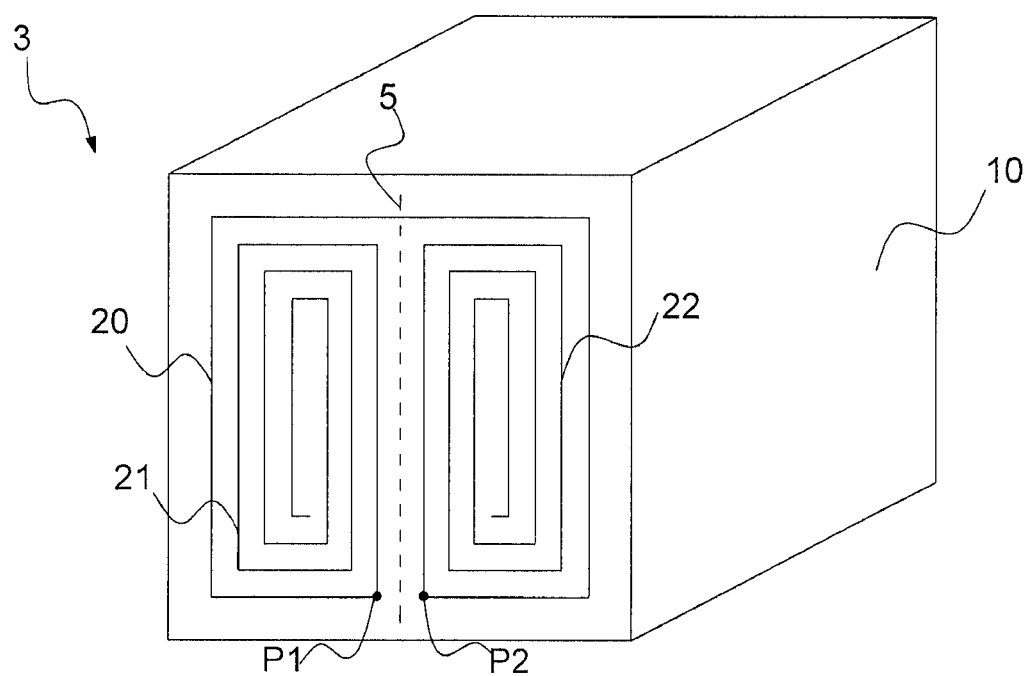
FIG. 6 illustrates a metamaterial unit of the metamaterial in FIG. 5.

Referring to FIGS. 5 to 6, the present disclosure provides a metamaterial that is highly integrated with the artificial microstructures. The metamaterial includes substantially uniformly thick substrate 1, where the substrate 1 can be virtually divided into a plurality of identical base units 10. Each of the base units 10 is a square parallelepiped. In one embodiment, a side (e.g., a width, a length or thickness) of the base unit 10 falls within a range, the range being between one tenth to one fifth of a wavelength of the electromagnetic wave in a specific frequency. Additionally, the thickness of the base unit 10 may be equal to, but not necessary to, the width or the length of the base unit 10. In one example, the thickness of the base unit 10 can be required to be not greater than the width or length of the base unit 10. The substrate 1 is equivalent to an array which includes a plurality of the rectangular base units 10. The base units 10 are arranged along the X-direction for the row, the Y-direction for the column, and the Z direction for the stack. Each two of the X-direction, the Y-direction, and the Z-direction are orthogonal. For example, the X-direction is orthogonal to the Y-direction and the Z-direction. The substrate 1 may be made of, but are not limited to, FR-4, F4B, CEM1, CEM3, and TP-1 ceramic materials. If the substrate 1 is in a circular ring shape, the substrate 1 may be fixed along an axis which passes through a center of the substrate 1 and is vertical to the surface of the substrate 1.

Each of the artificial microstructure 2 is attached to one base unit 10. A metamaterial unit 3 is made up of one base unit 10 and one artificial microstructure 2 attached to the base unit 10. As shown in FIG. 6, the metamaterial of the present disclosure is made up of a plurality of the metamaterial unit 3, which are arranged along the X-direction, Y-direction, and the Z-direction into the array.

Each of the first artificial microstructures 2 is arranged into a specific geometric structure (e.g., a plane structure or a solid structure) by wires. The wires may be metal wires or non-metal wires. The metal wires may be, but are not limited to, a copper wire, a silver wire, a golden wire, or an alloy which is composed of two or more metal elements. The non-metal wire may be, but are not limited to, conductive plastic, indium tin oxide (ITO), carbon nanotubes, and black lead. The first artificial microstructure 1 can be influenced by electromagnetism.

The artificial microstructure 2 includes a split resonant ring 20 having a ring shape with a split, and two curves respectively extending from the first end P1 and the second end P2 of the split resonant ring 20, as shown in FIG. 6. The two curves do not intersect with each other and also do not intersect with the split resonant ring 20. In one embodiment, the two curves are a first spiral 21 and a second spiral 22. The first spiral 21 starts from the first end P1 and clockwise revolves around inside the split resonant ring 20. The second spiral 22 starts from the second distal end P2 and counterclockwise revolves around inside the split resonant ring 20 The first spiral 21 does not intersect with the second spiral 22. Furthermore, the first spiral 21 and the second spiral 22 do not intersect with the split resonant ring 20.

Figure 7:
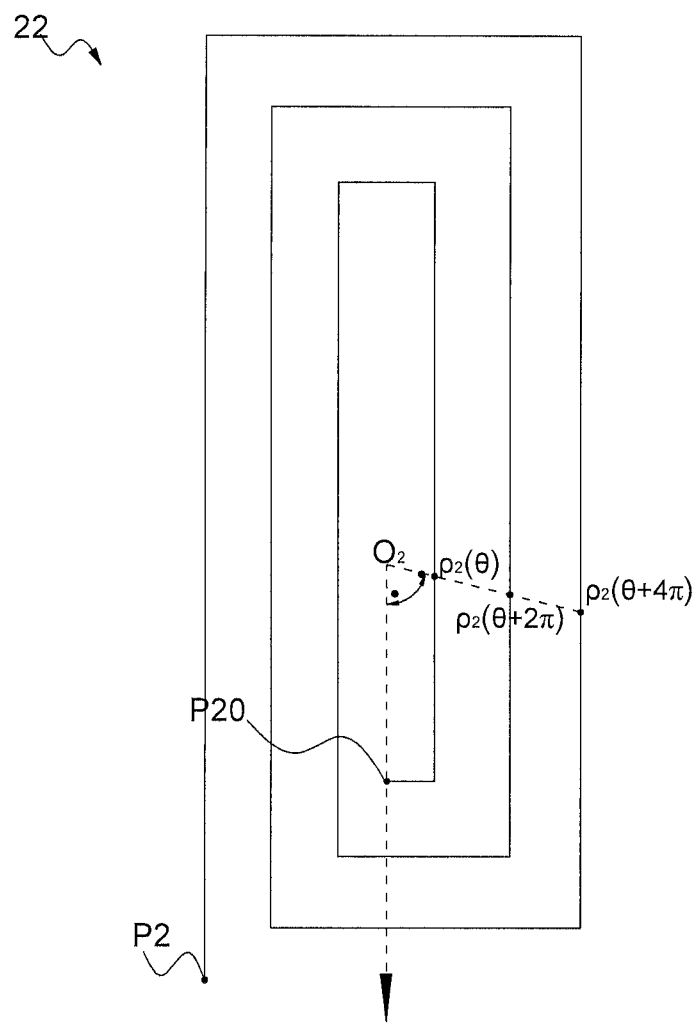
FIG. 7 illustrates a spiral of the artificial microstructure in FIG. 6 in a polar coordinate system.

Referring to FIG. 7, "spiral" in the present disclosure is defined as: a curve is in a plane, the plane exists a point O, the point O is used as the pole of the polar coordinate system, a ray starting from the point O and passing through one end of the curve is used as the polar axis of the polar ordinate system, the counterclockwise direction is used as a positive direction. Thus, any point on the curve is located in the polar coordinate system, and can be identified by the pair of coordinates ($\rho$, $\theta$), where $\rho$ is a radial coordinate of the point, $\theta$ is the angular coordinate of the point, and $\rho(\theta)$ is a function related to the radial coordinate and the angular coordinates. If any curve satisfies the function $\rho(\theta)$ upon three conditions as below, then the curve is the spiral. The three conditions include a first condition, a second condition, and a third condition.

The first condition is that the curve satisfies $\rho'(\theta) \neq \infty$, the curve is consecutive and has no breakpoints on the curve.

The second condition is that the curve satisfies $\rho(\theta) < \rho(\theta+2\pi)$, the curve does not intersect with itself.

The third condition is that the curve satisfies $\theta_0 > 2\pi$, where $\theta_0$ is the angular coordinate of the other end.

Taking the second spiral 22 as example, the point O2 is the pole of the polar ordinate system, the ray passes the point O2 and the second end of the curve P20, the counterclockwise direction is the positive direction, the angular coordinate of P20 is equal to zero degrees. Any point on the second spiral 22 satisfies the first condition and the second condition mentioned above, and the angular coordinate of the other end of the curve P2 (the same as the other end of the split resonant ring 20) is about $5.5\pi$, then any point also satisfies the third condition. Thus, the second spiral 22 is determined as being a spiral. In one exemplary embodiment, the loop number of the second spiral 22 is at least equal to or greater than two loops, and the angular coordinate of the second end of the curve P2 is equal to or greater than $4\pi$.

Depending on the embodiment, the first spiral 21 and the second spiral 22 are identified in the same polar ordinate system. The first spiral 21 satisfies the function $\rho 1(\theta)$, and the second spiral 22 satisfies the function $\rho 2(\theta)$. The first spiral 21 intersects with the second spiral 22 upon the two conditions as follows: $\rho 1(\theta 1) = \rho 2(\theta 2)$, and $\theta 1 = \theta 2 + 2k\pi$, and k is equal to an integer, where $\rho 1(\theta 1)$ and $\theta 1$ are from any point $(\rho 1(\theta 1), \theta 1)$ in the first spiral 21, and $\rho 2(\theta 2)$ and $\theta 2$ are from the any point $(\rho 2(\theta 2), \theta 2)$ in the second spiral 22. In contrast, if the first spiral 21 does not satisfy the two conditions, then the first spiral 21 does not intersect with the second spiral 22.

Additionally, an imaginary line 5 can be drawn between the first spiral 21 and the second spiral 22, where the first spiral 21 lies along one side of the line 5 and the second spiral 22 lies along the other side of the line 5. For example, as shown in FIG. 6, the first spiral 21 lies along the left side of the line 5 and the second spiral 22 lies along the right side H of the line 5. In one embodiment, the first spiral 21 is symmetrical with the second spiral 22. As shown in FIG. 6, the line 5 is an axis of symmetry. If the first spiral 21 and the second spiral 22 are folded over the axis, the first spiral 21 and the second spiral 22 are identical.

The first spiral 21 and the second spiral 22 are generated by the arrangement of wires in the split resonant ring 20 of the present disclosure. According to the second condition mentioned above, a distance exists between any two points from either the first spiral 21 or the second spiral 22, where the two points are $(\rho(\theta), \theta)$, and $(\rho(\theta+2\pi), \theta+2\pi))$. The distance between the two points is equal to $\rho(\theta+2\pi) - \rho(\theta)$. The two points are equivalent to two plates of a capacitor when the split resonant ring 20 is influenced by electromagnetism, the distance between the two plates is equal to $\rho(\theta+2\pi) - \rho(\theta)$. In such a situation, the first spiral 21 (or the second spiral 22) is equivalent to the capacitor, where the distance of the plate is equal to a length of the first spiral 21 (or the second spiral 22), and the plate is in a spiral shape.

Capacitance of the capacitor is computed by a known formula:

$$C = \epsilon A/d = \epsilon_0 \epsilon_r A/d.$$

where, $\epsilon_0$ is a vacuum permittivity, $\epsilon_r$ is relative permittivity of the substrate 1, A is an area of the plates of the capacitor, and d is the distance between the two plates of the capacitor. The area of the plates of the capacitor satisfies the function $A = L0t$, where $L0$ is equal to the length of the first spiral 21 or the second spiral 22, t is a thickness of the wires attached to the substrate 1. From the known formula C, if no other conditions are considered, the longer the length of the first spiral and the second spiral are, and the closer the distance between the first spiral 21 and the second spiral 22 are, then capacitance of the capacitor increases.

The longer the line of an indicator correlates to greater inductance of the indicator. It is determined by a known formula of the inductance.

The LC circuit satisfies the formula $$f_0 = \frac{1}{2\pi \sqrt{LC}}.$$

From the formula, the resonant frequency for decreases when the inductance L increases.

Compared to the structure of the typical metamaterial in FIG. 4, the metamaterial of the present disclosure is superior to the typical metamaterial of FIG. 4.

Figure 8:
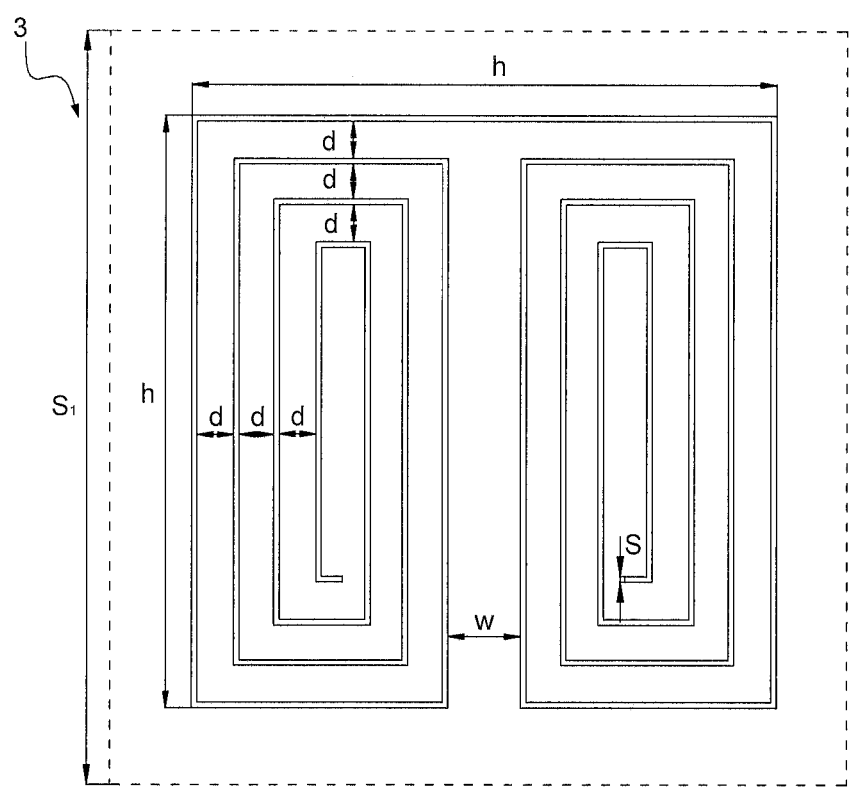
FIG. 8 illustrates a dimension of a structure of a metamaterial unit of the metamaterial in FIG. 5.

FIG. 4 shows the third typical artificial microstructure, and FIG. 8 illustrates a dimension of a structure of a metamaterial unit in FIG. 5. The substrates of the FIG. 4 and FIG. 8 are epoxy resin. Grade designation of the epoxy resin is FR-4.

In one exemplary embodiment, the dimension of the metamaterial unit 3 in the FIG. 4 and FIG. 8 is 25 mm×25 mm×25 mm.

As shown in FIG. 4, S2=25 mm, H=24 mm, D=10 mm, W=4 mm, S=0.025 mm. After simulation on the first typical split resonant ring, the resonance frequency of the typical split resonant ring is around 25 GHz.

As shown in FIG. 8, $S_1$=25 mm, h=24 mm, d=10 mm, w=4 mm, S=0.025 mm. After simulation on the split resonant ring having one or more loops in a spiral structure, the resonance frequency of the split resonant ring having one or more loops in a spiral structure is around 8 GHz.

Assuming that the length of the artificial microstructure in FIG. 4 and FIG. 8 is the same, the length may be, but is not limited to, 120 mm.

The permeability of the typical metamaterial unit is measured as $\mu$=5.4 H, when the dimension of the typical metamaterial unit is 25 mm×25 mm×25 mm.

In one embodiment of present disclosure, the dimension of the metamaterial unit 3 in the FIG. 7 is 10 mm×10 mm×10 mm, and S1=10 mm, h=8 mm, d=0.5 mm, w=0.5 mm, S=0.025 mm. After simulation on the split resonant ring having one or more loops in a spiral structure, the permeability of the metamaterial unit 3 is measured as $\mu$=5.6.

Apart from the artificial microstructure, any other parameters are the same in FIG. 4, FIG. 7 and FIG. 8. From the measured results mentioned above (e.g., resonance frequency and permeability) in FIG. 4, FIG. 7 and FIG. 8, if the dimension of the first artificial microstructure 2 (or the dimension of the metamaterial unit 3) is fixed, the resonance frequency of the metamaterial unit 3 having the spiral structure moves toward a lower frequency. Additionally, if the permeability of the metamaterial unit 3 is fixed, the dimension of the metamaterial unit 3 having the spiral structure is smaller than the typical metamaterial unit, then the substrate 1 can accommodate more metamaterial units 3 having the spiral structure. Thus, the metamaterial units 3 having the spiral structure can lead to a small volume and high integration effect.

In present disclosure, the minimum distance between each concentric square of the first spiral 21 or the second spiral 22 can be 0.1 mm. The length of the first artificial microstructure 2 of the present disclosure can be a tenth of the length in FIG. 4, the width of the first artificial microstructure 2 of the present disclosure can be a tenth of the width in FIG. 4, the area of the artificial microstructure 2 of the present disclosure can be 1% area of the third typical artificial microstructure 2 in FIG. 4.

Figure 9:
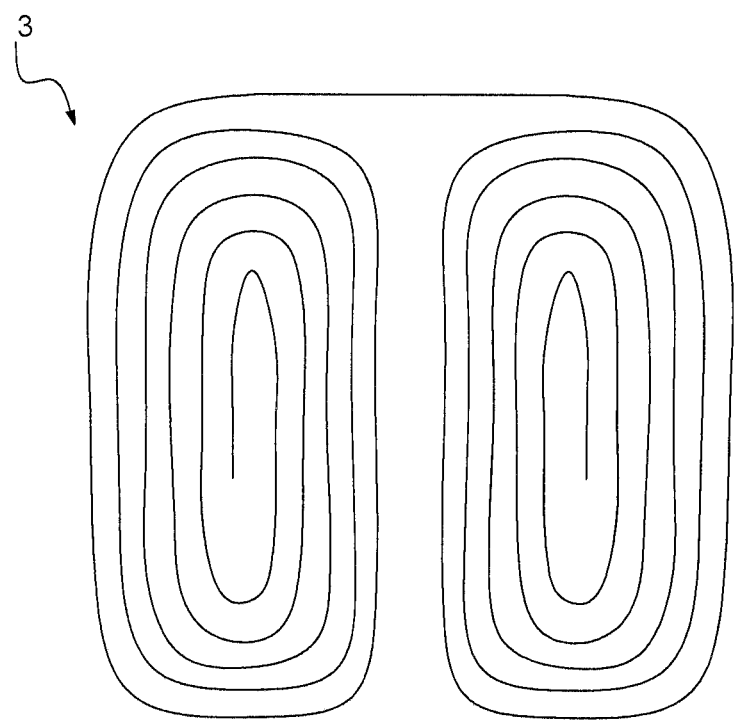
FIG. 9 illustrates a second embodiment of an artificial microstructure.

The first spiral 21 and the second spiral 22 may be, but are not limited to, a square spiral or a circular spiral. The square spiral satisfies the first condition, the second condition and the third condition mentioned above. The square spiral is made up of a plurality of line segments that starts with a smallest line segment. Length of the line segments increases as the square spiral revolves around outside. Each two consecutive line segments are vertically connected, as shown in FIG. 8. The circular spiral satisfies the first condition, the second condition and the third condition mentioned above, and the circular spiral also satisfies the function $f''(\theta)\neq\infty$, where the circular spiral is a smooth curve without a sharp angle or a salient point, as shown in FIG. 9.

Figure 10:
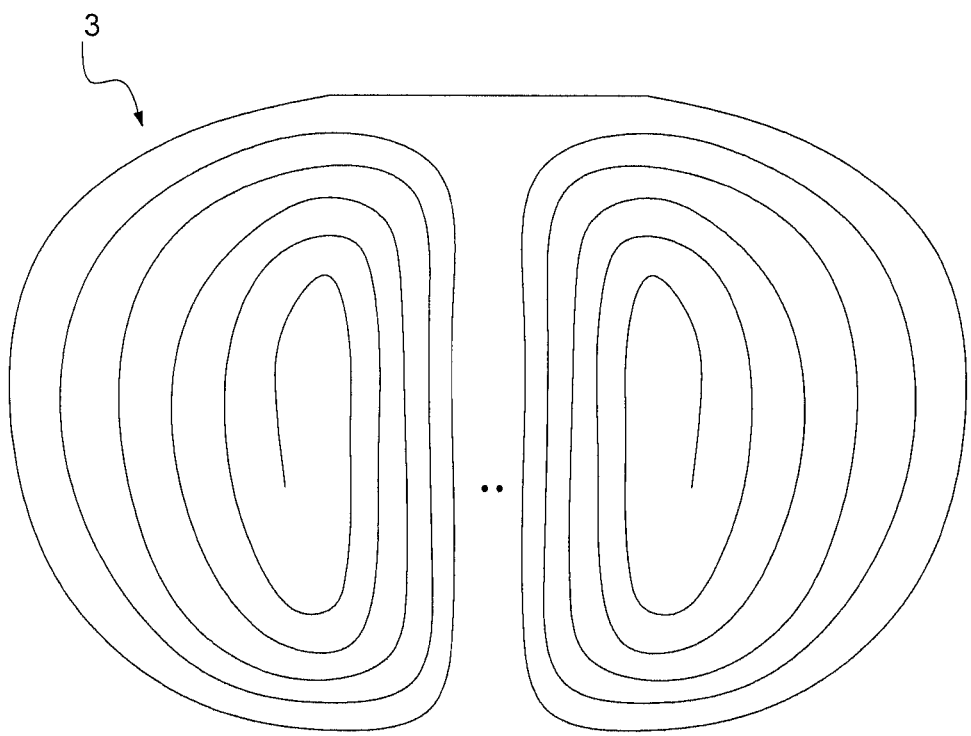
FIG. 10 illustrates a third embodiment of an artificial microstructure.

Referring to the first artificial microstructure 2 as shown in FIG. 8, the distance between each concentric square is the same. Referring to the second artificial microstructure in FIG. 9, the distance between each concentric circle may be approximately the same. In other words, any two points in the first spiral 21 satisfy the equation $\rho_1(\theta_1+2\pi)-\rho_1(\theta_1)=\rho_1(\theta_1+4\pi)-\rho_1(\theta_1+2\pi)$, and any two points in the second spiral 22 satisfies the equation $\rho_2(\theta_2+2\pi)-\rho_2(\theta_2)=\rho_2(\theta_2+4\pi)-\rho_2(\theta_2+2\pi)$. Additionally, distance between each concentric square of the first spiral 21 (or the second spiral 22) may vary. As shown in FIG. 10, the distance between each concentric square of the first spiral 21 (or the second spiral 22) varies.

Figure 11:
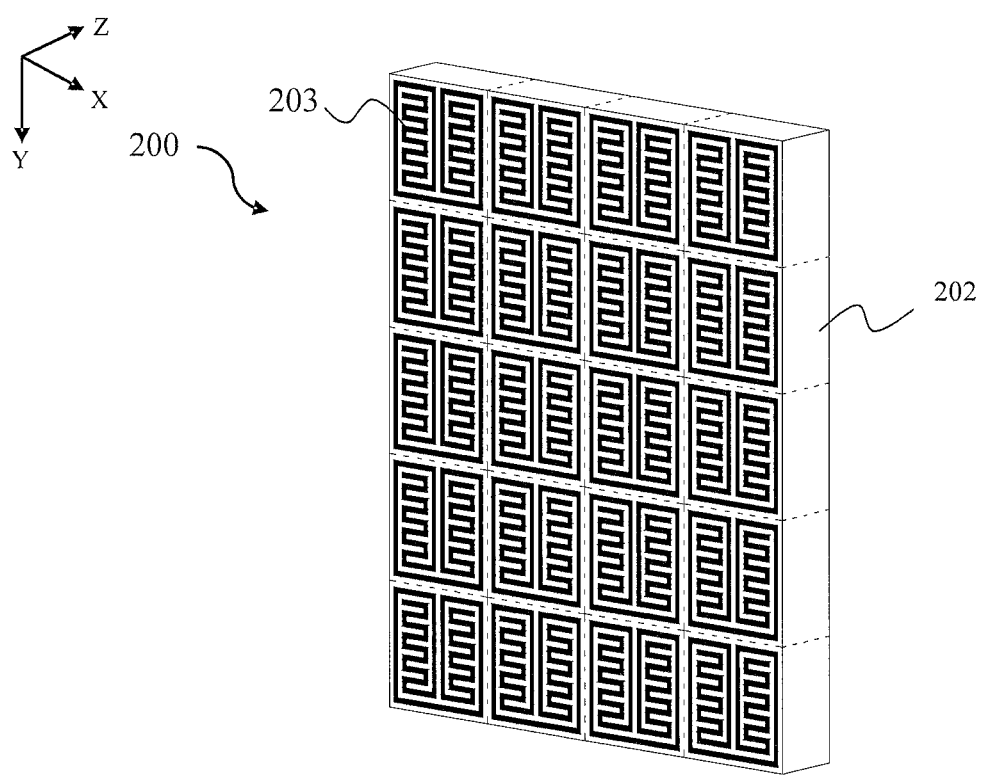
FIG. 11 illustrates a fourth embodiment of a metamaterial.
Figure 12:
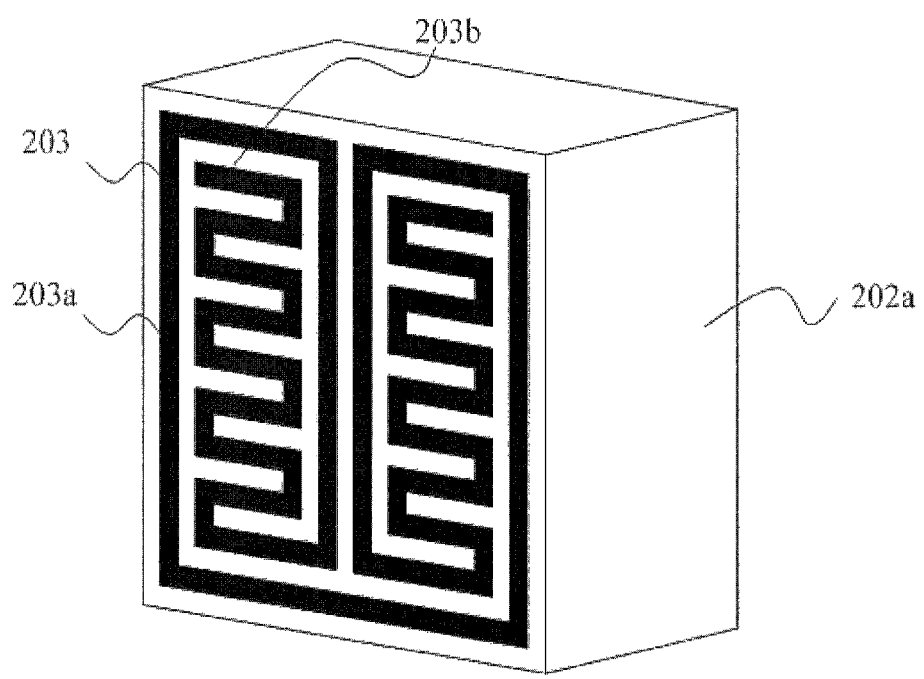
FIGS. 12-13 illustrate a base unit of the metamaterial in FIG. 11.
Figure 13:
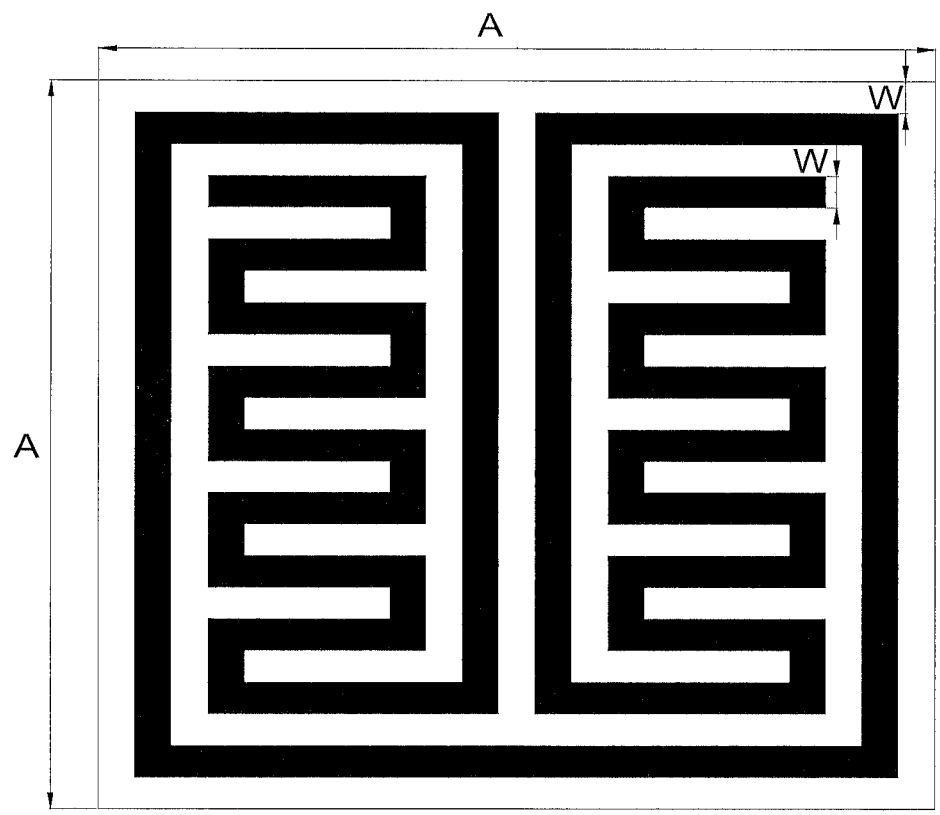

Referring to FIGS. 11-13, the difference between the artificial micro structure of the fourth embodiment of the present invention and the typical artificial micro structure shown in FIG. 1 is explained as below. The artificial micro structure 203 includes two serpentine lines 203b and a split resonant ring 203a. The split resonant ring 203a includes two distal ends. The split resonant ring 203a is an inverted image of the first typical split resonant ring as shown in FIG. 4. In other word, the split resonant ring 203a is approximately in a shape of a Chinese character "凹," and the gap of the resonance ring 203a is at a concave part of the Chinese character "凹". The split resonant ring 203a has two distal ends. Each distal end connects to a serpentine line 203b. Each serpentine line 203b is made up of a plurality of line segments. Each serpentine line 203b starts from one of the two distal ends and extends forward using the line segments. The line segments either are parallel or vertical to each other.

In the metamaterial filed, the artificial microstructure is analyzed to obtain an electromagnetism characteristic impact on the metamaterial, when the artificial microstructure is equivalent to a circuit. In present invention, the split resonant ring adds serpentine lines (e.g., two serpentine lines 203b as shown in FIGS. 11 to 13). Each two adjacent line segments of the serpentine line are equivalent to two plates of the capacitor, then each of the two the serpentine lines includes two or more minor capacitors. Each of the two serpentine lines is equivalent to an electric resistance of the two or more minor capacitors connected in series. The two serpentine lines are equivalent to a general capacitor consisted of the two or more minor capacitors. Comparing with the typical ring having no serpentine lines, the artificial microstructure of the present invention can have more capacitance.

In electromagnetism, permeability $\mu$ is computed according to the following: $\mu=B/H$, where B is magnetic flux density and H is magnetic field intensity. From the formula, the permeability $\mu$ is directly proportional to the magnetic flux density B. Additionally, increasing number of capacitors is equivalent to increasing capacitance, and increasing capacitance collects more charges. Because of the electromagnetic effect, more charges effectively increase the magnetic flux density. The artificial microstructure of the present disclosure is equivalent to increasing the number of capacitors. Thus, the artificial microstructure of the present disclosure increases the magnetic flux density, and also increases absolute value of the minus permeability.

For example, in the fourth embodiment of the metamaterial unit of the metamaterial shown in FIG. 12, the metamaterial unit is made up of one base unit 202a and one artificial microstructure 203 as shown in FIG. 12. The substrate 202 is epoxy resin, having the grade designation FR-4. In one exemplary embodiment, the thickness of the substrate 202 can be about 0.4 mm and exemplary dimensions of the base unit 202a can be about 40 mm×40 mm×0.4 mm (e.g., A=40 mm). The artificial microstructure 203 is made of a copper wire and thickness of the copper wire can be about equal to 0.018 mm. The base unit 202a has a buffer distance from each of four sides of the base unit 202a to the artificial microstructure. The buffer distance W can be about equal to 1 mm. The width W of the line segments can be about equal to 1 mm, and the interval of the serpentine line 203b can be about equal to 1 mm.

Figure 14:
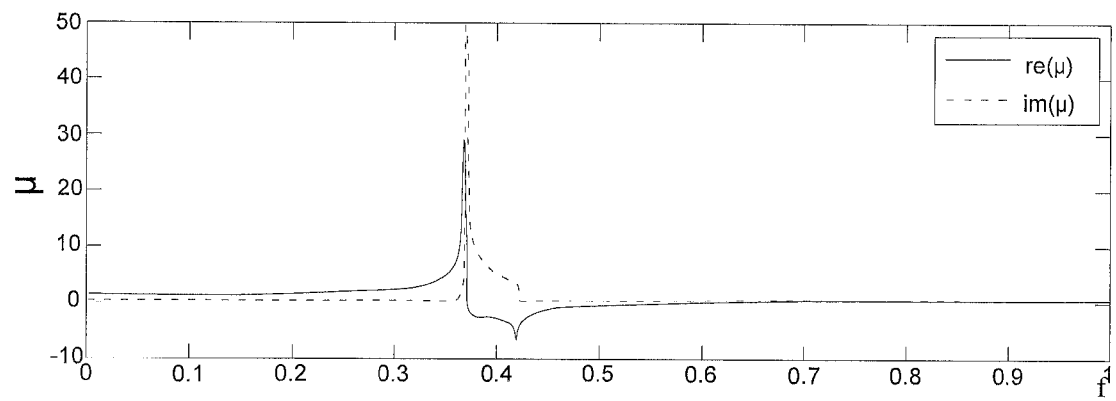
FIG. 14 illustrates a graphic of a simulation on the typical metamaterial in FIG. 1.

Simulation on the metamaterial unit of FIG. 12, an electromagnetic response graphic of the frequency corresponding to the permeability is obtained as shown in FIG. 14. From the FIG. 14, the permeability of the metamaterial unit is negative if the frequency falls within a range of [0.21 GHz-0.24 GHz]. The minimum of the permeability is minus 26H, and the imaginary part of the permeability is very low and close to zero.

Figure 15:
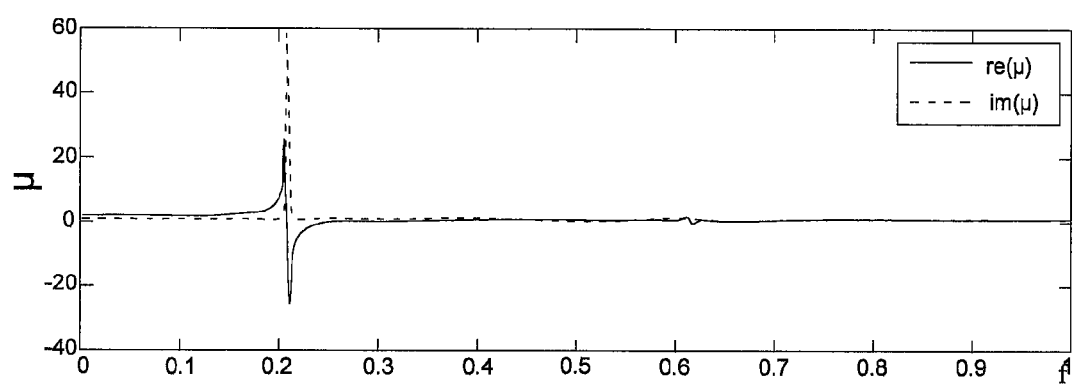
FIG. 15 illustrates a graphic of a simulation on the metamaterial in FIG. 11.

Compared to the metamaterial unit of FIG. 12 or FIG. 13, simulation on the metamaterial unit of FIG. 1 under the same conditions as the metamaterial unit of FIG. 12 or FIG. 13, the electromagnetic response graphic of the frequency corresponding to the permeability is obtained as shown in FIG. 15. From the FIG. 15, the permeability of the metamaterial unit is negative if the frequency falls within a range of [0.38 GHz-0.46 GHz]. The minimum of the permeability is minus 5.5H, and the absolute value of the permeability is little, thereby cannot achieve a desired effect of the minus permeability.

Therefore, the artificial microstructure of the present disclosure can increase the absolute value of the minus permeability of the metamaterial, thereby satisfy specific conditions to obtain a minus permeability, and thereby can achieve the desired effect of the minus permeability.

Figure 16:
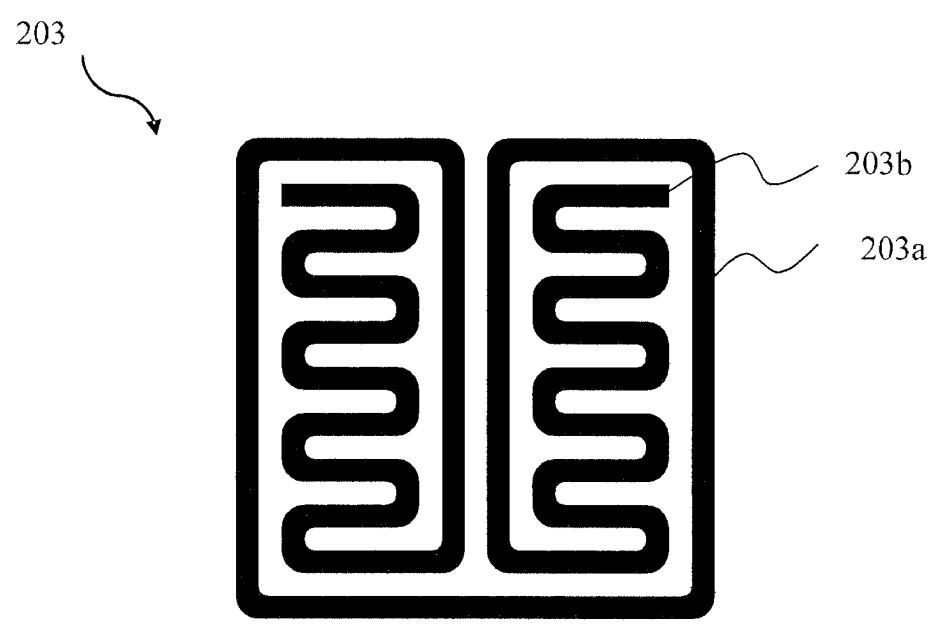
FIG. 16 illustrates a fifth embodiment of an artificial microstructure.
Figure 17:
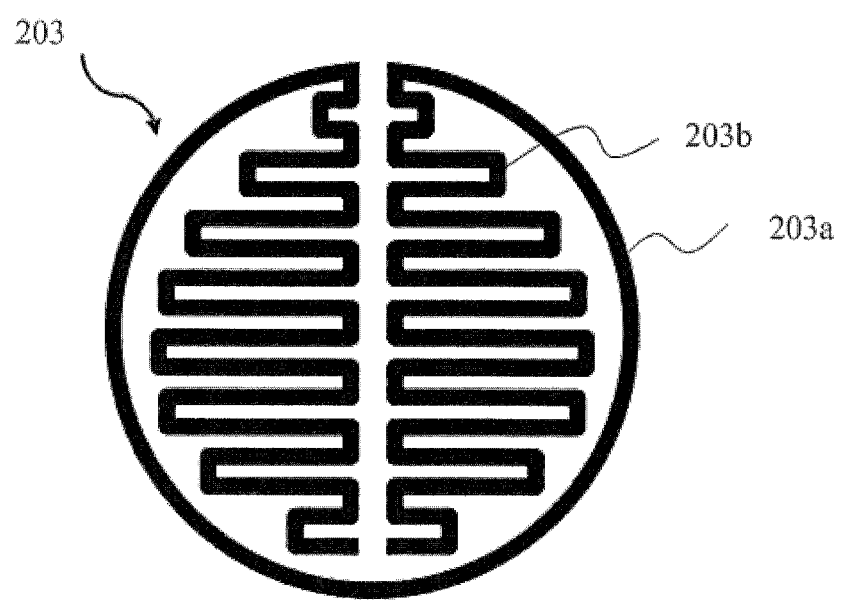
FIG. 17 illustrates a sixth embodiment of an artificial microstructure.

The present disclosure has been specifically described on the basis of the exemplary embodiment, the present disclosure is not to be construed as being limited thereto. For example, the corners of the split resonant ring may be, but not limited to, a square corner as shown in FIG. 13 or a rounded corner as shown in FIG. 16. Additionally, the split resonant ring may be, but not limited to, a circular ring with a split as shown in FIG. 17. The two spirals may be identical or vary from each other. The two spirals are alongside arranged in parallel or mirror symmetry.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:
1. An artificial microstructure comprising:
   a split resonant ring comprising a conductive wire; and two curves comprising the conductive wire, wherein a first curve of the two curves starts from a first end of the split resonant ring and a second curve of the two curves starts a second end of the split resonant ring and the two curves extend, in a serpentine pattern, along two inner sides of the split resonant ring, the two curves do not intersect, each curve of the two curves forms a plurality of parallel flat parts and a plurality of connection parts, one connection part of the plurality of connection parts is connected to two adjacent parallel flat parts of the plurality of parallel flat parts; and an interval distance between the two adjacent parallel flat parts of the plurality of parallel flat parts of each of the two curves is equal to a width of the conductive wire, each two adjacent parallel flats of the plurality of parallel flat parts of each of the two curves cooperatively form a capacitor, and each of the two curves comprises more than one capacitor connected in series.

2. The artificial microstructure of claim 1, wherein the two curves have an axial symmetrical distribution.

3. The artificial microstructure of claim 1, wherein the split resonant ring is a rectangular split resonant ring.

4. The artificial microstructure of claim 1, wherein the split resonance ring is a circular split ring.

5. The artificial microstructure of claim 1, wherein a corner of each of the two curves is a vertical corner.

6. The artificial microstructure of claim 1, wherein a corner of each of the two curves is a rounded corner.

7. The artificial microstructure of claim 1, wherein the artificial microstructure comprises non-metals.

8. The artificial microstructure of claim 1, wherein the artificial microstructure is selected from the group consisting of conductive plastic, indium tin oxide (ITO), carbon nanotubes, and black lead.

9. A metamaterial, comprising:
a substrate and a plurality of artificial microstructures that each has features according to the artificial microstructure of claim 1;
each artificial microstructure of the plurality of the artificial microstructures is attached to the substrate.

10. The metamaterial of claim 9, wherein each artificial microstructure of the plurality of the artificial microstructures is arranged into an array on the substrate.

11. The metamaterial of claim 9, wherein the substrate is divided into a plurality of rectangular base units, and an artificial microstructure of the plurality of artificial microstructures is attached to a corresponding rectangular base unit of the plurality of rectangular base units.

* * * * *